(12) United States Patent
Bliss

(10) Patent No.: US 12,392,682 B2
(45) Date of Patent: Aug. 19, 2025

(54) METHODS AND SYSTEMS FOR PREDICTING CONDUCTOR HEALTH

(71) Applicant: LINDSEY MANUFACTURING CO., Azusa, CA (US)

(72) Inventor: Ryan Bliss, Lindon, UT (US)

(73) Assignee: LINDSEY MANUFACTURING CO., Azusa, CA (US)

( * ) Notice: Subject to any disclaimer, the term of this patent is extended or adjusted under 35 U.S.C. 154(b) by 0 days.

(21) Appl. No.: 17/923,524

(22) PCT Filed: May 4, 2021

(86) PCT No.: PCT/US2021/030730
§ 371 (c)(1),
(2) Date: Nov. 4, 2022

(87) PCT Pub. No.: WO2021/226142
PCT Pub. Date: Nov. 11, 2021

(65) Prior Publication Data
US 2024/0201042 A1    Jun. 20, 2024

Related U.S. Application Data

(60) Provisional application No. 63/019,649, filed on May 4, 2020.

(51) Int. Cl.
*G01M 5/00* (2006.01)
(52) U.S. Cl.
CPC ........ *G01M 5/0041* (2013.01); *G01M 5/0025* (2013.01)
(58) Field of Classification Search
CPC ............. G01M 5/0025; G01M 5/0041; G01M 5/0033; G01N 3/28; G01N 19/08;
(Continued)

(56) References Cited

U.S. PATENT DOCUMENTS

| | | | |
|---|---|---|---|
| 6,205,867 B1 * | 3/2001 | Hayes | H02G 7/02 73/862.391 |
| 7,494,271 B2 * | 2/2009 | Scholtz | H02J 3/00 374/185 |

(Continued)

FOREIGN PATENT DOCUMENTS

| | | | | |
|---|---|---|---|---|
| CN | 110442898 A | 11/2019 | | |
| WO | WO-2007134022 A2 * | 11/2007 | ............... | G01C 9/00 |

OTHER PUBLICATIONS

Kumar, P., & Singh, A. K. (2019). Optimal mechanical sag estimator for leveled span overhead transmission line conductor. Measurement: Journal of the International Measurement Confederation, 137, 691-699. https://doi.org/10.1016/j.measurement 2019.01.067 (Year: 2019).*

(Continued)

*Primary Examiner* — Huy Q Phan
*Assistant Examiner* — Martin Walter Braunlich
(74) *Attorney, Agent, or Firm* — Womble Bond Dickinson (US) LLP

(57) ABSTRACT

Embodiments of the application relate to methods and systems for monitoring and predicting a conductor's health using original manufacturer conductor specifications (1), in-use conductor clearance (6), in-use conductor temperature (5), and perhaps even in-use conductor tilt (15) to calibrate a conductor health model and continuing to recalibrate a conductor health model throughout the life of a conductor.

44 Claims, 13 Drawing Sheets

(58) Field of Classification Search
CPC ..... G01N 2203/006; G01N 2203/0062; G01N 2203/0067; H02J 13/00006; H02J 13/00; H02J 13/00034; H02J 13/00002; G01K 1/143; Y04S 10/30; G01L 5/102; G01L 5/107; G01R 31/08; G01R 31/086; G01R 31/58; H02G 1/02; H02G 7/00; H02G 7/02; H02G 7/04; H01R 4/28; Y10T 29/49117

See application file for complete search history.

(56) References Cited

U.S. PATENT DOCUMENTS

| | | | |
|---|---|---|---|
| 7,516,051 | B2 | 4/2009 | Johnson et al. |
| 9,519,014 | B2 | 12/2016 | Aaserude et al. |
| 10,197,610 | B2* | 2/2019 | Lilien ................ G01R 19/0092 |
| 2007/0200556 | A1 | 8/2007 | Engelhardt |
| 2008/0189061 | A1 | 8/2008 | Scholtz et al. |
| 2014/0177672 | A1 | 6/2014 | Davis |
| 2014/0180616 | A1 | 6/2014 | Aaserude et al. |
| 2017/0227677 | A1 | 8/2017 | Godard |
| 2018/0316219 | A1 | 11/2018 | Bliss et al. |
| 2019/0235011 | A1* | 8/2019 | Pinney .................... G01S 17/50 |

OTHER PUBLICATIONS

M. L. Lu and Z. Kieloch, "Accuracy of Transmission Line Modeling Based on Aerial LiDAR Survey," in IEEE Transactions on Power Delivery, vol. 23, No. 3, pp. 1655-1663, Jul. 2008, doi: 10.1109/TPWRD.2007.911164. (Year: 2008).*

Extended European Search Report for corresponding EP Patent Application No. 21800826.6, completed Apr. 24, 2024 (5 sheets).

International Search Report and Written Opinion for corresponding PCT Application No. PCT/US2021/030730, mailed Sep. 9, 2021 (10 pages).

Harvey, J.R., "Effect of Elevated Temperature Operations on the Strength of Aluminum Conductors", IEEE Transactions on Power Apparatus and Systems, vol. PAS-91, No. 5, pp. 1769-1772, Sep. 1972.

Marmillo, Jonathan, *"Dynamic Line Ratings"*, Southwest Power Pool Technology Expo 2018, LineVision Inc. (42 pages).

Naranpanawe, Lakshitha, et al., *"Overhead Conductor Condition Monitoring, Milestone Report 1"*, Power & Energy Systems Research Group School of Information Technology & Electrical Engineering, The University of Queensland, Brisbane, Queensland, Dec. 2018 (52 pages).

Stephen, R. et al., *"Guide for Application of Direct Real-Time Monitoring Systems"*, Working Group B2.36, Jun. 2012, CIGRE (79 pages).

Overhead Conductor Manual 3rd Edition Advertisement, Southwire Company, LLC, 2017, (1 page).

* cited by examiner

FIG. 6

METHODS AND SYSTEMS FOR PREDICTING CONDUCTOR HEALTH

CROSS-REFERENCE TO RELATED APPLICATIONS

This application is a National Phase patent application of International Patent Application Number PCT/US2021/030730, filed on May 4, 2021, which claims priority to and the benefit of U.S. Provisional Application No. 63/019,649 filed on May 4, 2020, both of which are incorporated by reference herein in their entirety.

TECHNICAL FIELD

Embodiments of the application relate to methods and systems for monitoring and predicting conductor health using original manufacturer conductor specifications, in-use conductor clearance, in-use conductor temperature, and perhaps even in-use conductor tilt to calibrate a conductor health model and continuing to recalibrate a conductor health model throughout the life of a conductor.

BACKGROUND

Utility power can be produced by a number of different power generators and delivered to end customers through a system of power transmission and distributions lines. Power transmission lines may generally be high voltage lines used to transmit power from power generators to locations (e.g., power substations) where the power may be distributed through lower voltage power distribution lines to end customers. Transmission line power throughput may be constrained by the heating of the line which can result in thermal expansion of the conductor, lengthening it, and even manifesting itself as increased sag in the line. Regulations may require transmission system operators to control the amount of power throughput (i.e., ampacity) in the lines such that the lines do not heat to the point that thermal expansion results in line sag where clearance with underlying features is reduced to the point that an unsafe condition occurs (e.g., line contacting underlying vegetation or structures). For safe operation, minimum clearances for transmission lines are specified, and the amount of power that can be transmitted through a line may be regulated conservatively by the specification of a line rating. Line ratings can be established for each line with conservative assumptions about ambient temperature (e.g., assumed to be relatively hot), wind speed (e.g., little wind for convective cooling of the line), and perhaps even cloud cover (e.g., no cloud cover to mitigate direct sunlight from heating the lines). Ambient conditions can have a large influence on how much power can be transmitted through a power line while complying with clearance requirements. Power utilities have historically used static line ratings to manage the capacity of their transmission lines to transmit power. Static line ratings are traditionally designed to be conservative, and generally reserve 30 percent or more of a line's capacity as buffer to avoid problems associated with line sag and clearance issues that can occur when certain environmental and load conditions are met. U.S. Pat. No. 9,519,014 to Aaserude et al., hereby incorporated by reference herein, provides real-time measurement of conductor temperatures and ground clearances using a transmission line monitor, coupled with information technology and data analytics, to allow utility operators to manage their transmission systems using a dynamic line rating process. Dynamic line ratings may incorporate real-time or near-real-time data of transmission line conditions in lieu of conservative assumptions, in order to more accurately assess actual transmission line performance such that more of the power conveying capacity of the existing transmission infrastructure can be accessed with continued compliance with safety requirements applicable to the transmission line system.

Creep may be a permanent elongation of a cable perhaps due to everyday tensions that a cable may experience over a period of time. Since temperatures may fluctuate year-round, an everyday tension may be averaged as the tension that occurs in a cable at a certain temperature. In warmer regions, an increase in average temperature may decrease average tensions, may lower permanent elongations, and may decrease the effect of creep. In colder regions, a decrease in average temperature may increase average tensions, may increase permanent elongations, and may increase the effect of creep. A permanent elongation of a cable can affect sag and tension calculations after a cable has crept.

Load may be a permanent elongation of a cable perhaps due to experiencing a heavy loading condition such as a heavy ice or extreme wind. Regardless of if the cable sees this load the day after it is installed, 10 years later, or even 50 years later, the cable can experience an increased tension associated with that heavy loading that may result in a permanent elongation. A permanent elongation can affect sag and tension calculations after that extreme event has occurred.

Creep strain may be a function of conductor stress (tension), conductor temperature, and even conductor duration. Conductor tension may reduce as a conductor ages and calculating creep may result in different values over time.

Historically, conductor health may have been correlated to the remaining strength of a conductor after some acceptable level of annealing, perhaps about 10% strength loss. Different kinds of events can cause annealing in a conductor such as ice loading, extreme wind loading, high conductor temperature, wildfires, or the like. It is difficult to predict the annealing in the design of a conductor; yet most design standards account for anticipated potential ice and wind loading events. In the past, transmission operators that consider high temperature operations, would track the time of high temperature operation and estimate the impact of that event. There is a need for a more accurate prediction of remaining strength of a conductor.

DISCLOSURE OF THE INVENTIONS

The present application includes a variety of aspects, which may be selected in different combinations based upon the particular application or needs to be addressed. In various embodiments, the application may include a conductor health monitoring system which may monitor the cumulative effect of events experienced in a conductor's life perhaps since installation.

It is a goal of some embodiments to provide a calibrated conductor health model for a conductor using in-use clearance and temperature data.

It is another goal of some embodiments to evaluate in-use tilt data from a conductor which can check if an event is an artificial ground event or a validated event or the like.

It is yet another goal of some embodiments to recalibrate a conductor health model as new data may be collected perhaps due to a validated event.

In another goal, some embodiments may use effective wind to recalibrate a conductor behavior model.

Naturally, further objects, goals and embodiments of the application are disclosed throughout other areas of the specification, claims, and drawings.

BRIEF DESCRIPTION OF THE DRAWINGS

FIG. 6 shows a non-limiting example of a sag/string chart as may be understood in various embodiments.

MODE(S) FOR CARRYING OUT THE INVENTIONS

Figure 1:
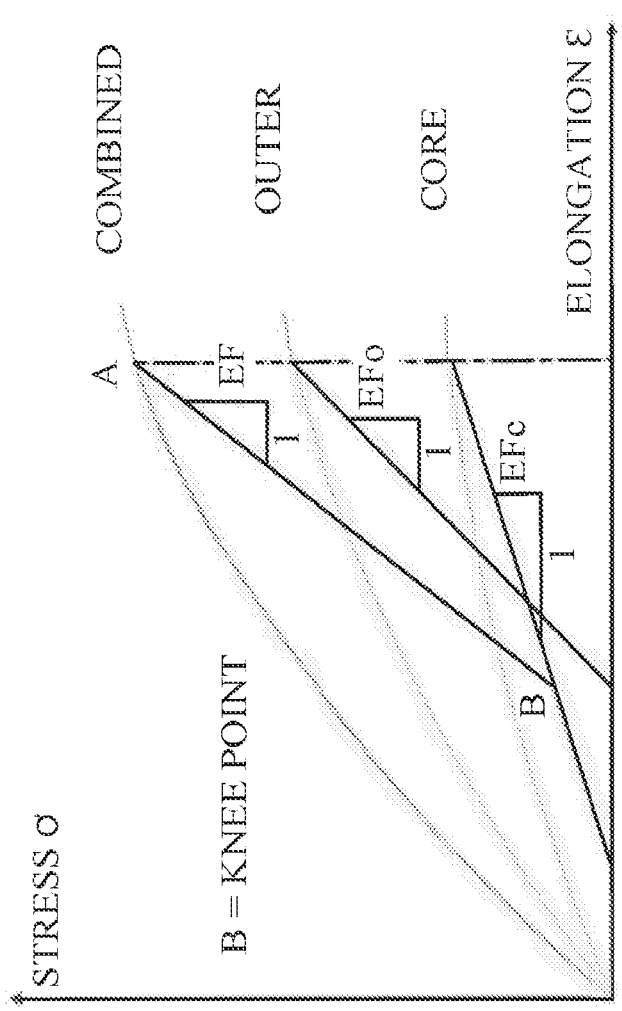
FIG. 1 shows a non-limiting example of a stress strain model of an ACSR Conductor as may be understood in various embodiments.

It should be understood that the present application includes a variety of aspects, which may be combined in different ways. The following descriptions are provided to list elements and describe some of the embodiments of the application. These elements are listed with initial embodiments; however, it should be understood that they may be combined in any manner and in any number to create additional embodiments. The variously described examples and preferred embodiments should not be construed to limit the application to only the explicitly described systems, techniques, and applications. The specific embodiment or embodiments shown are examples only. The specification should be understood and is intended as supporting broad claims as well as each embodiment, and even claims where other embodiments may be excluded. Importantly, disclosure of merely exemplary embodiments is not meant to limit the breadth of other more encompassing claims that may be made where such may be only one of several methods or embodiments which could be employed in a broader claim or the like. Further, this description should be understood to support and encompass descriptions and claims of all the various embodiments, systems, techniques, methods, devices, and applications with any number of the disclosed elements, with each element alone, and also with any and all various permutations and combinations of all elements in this or any subsequent application.

Embodiments may provide a method for monitoring and predicting power line conductor health comprising the steps of providing original manufacturer conductor specifications (1) for a conductor (2); installing said conductor (2) in a power line system (3); preparing an initially designed conductor health model (4) using said original manufacturer conductor specifications; continually measuring an in-use temperature (5) and an in-use clearance (6) of said conductor after installation to provide in-use conductor health data (7); calculating a creep (8) of said conductor from said in-use conductor health data; calibrating said initially designed conductor health model with said in-use conductor health data to provide a calibrated conductor health model (9); evaluating a strength (10) of a conductor based on said calibrated conductor health model; and perhaps even predicting the remaining strength (11) of said conductor. A system for monitoring and predicting power line conductor health may include an initially designed conductor health model using original manufacturer conductor specifications for a conductor in a power line system; continual in-use temperature and an in-use clearance measurement data of said conductor after installation; a calibrated conductor health model based on said initially designed conductor health model calibrated with said continual in-use temperature and an in-use clearance measurement data; a conductor strength based on said calibrated conductor health model; and perhaps even a predicted remaining strength of said conductor.

In some embodiments of the application, a conductor's behavior may be monitored to determine creep and comparing it to its original installation parameters. A correlation of strength loss to creep may be done by computing an effective high temperature conductor creep and even a corresponding conductor strength loss. A new system may create an analytic which can visualize the life of a conductor perhaps in reference to its creep even starting at an initial install, through a typical expected final or load creep, and finally by ultimate creep perhaps caused by an acceptable amount of strength loss.

Dynamic line rating systems can monitor transmission line operational capacity of a conductor (2) in a power line system (3) once installed given the in-situ condition of the line and weather. A system may be able to determine the actual conductor position, its clearance, and even temperature behavior. A system may configure and calibrate a conductor and may establish a link between an original conductor design such as with its original manufacturer conductor specifications and its as-built behavior with in-use conductor health data. This linkage may allow a system to extrapolate from measured conditions expected behavior perhaps at elevated temperatures.

Original manufacturer conductor specifications (1) may include an original sag chart of a conductor, an original plan and profile chart of a conductor, original LiDAR survey data from a conductor, any combination thereof, or the like. Original sag charts could be used in configuring a system and thus design standards may be linked to a system configuration. In the past, PLS-CADD files may have been used to configure a system. Embodiments of the application can provide ways to link monitored conductor behavior with design codes and standards.

Stranded conductors may exhibit complex behavior perhaps because of the interactions among inter-strand frictions, strand settlement, and even metallurgical creep. Empirical conductor models may improve the accuracy of sag and tension predictions perhaps by using accurate laboratory data to model more complex aspects of conductor behavior.

If a conductor may be composed solely of aluminum strands, it could follow the OUTER stress and relaxation curve shown in blue in FIG. 1. A steel core by itself could behave as shown for the CORE in green. A COMBINED behavior, representative of an ACSR conductor, is shown in yellow. Note the discontinuity at B in the relaxation curve that may occur when the aluminum may be fully supported by the steel. This discontinuity point may be referred to as the knee-point.

Figure 2:
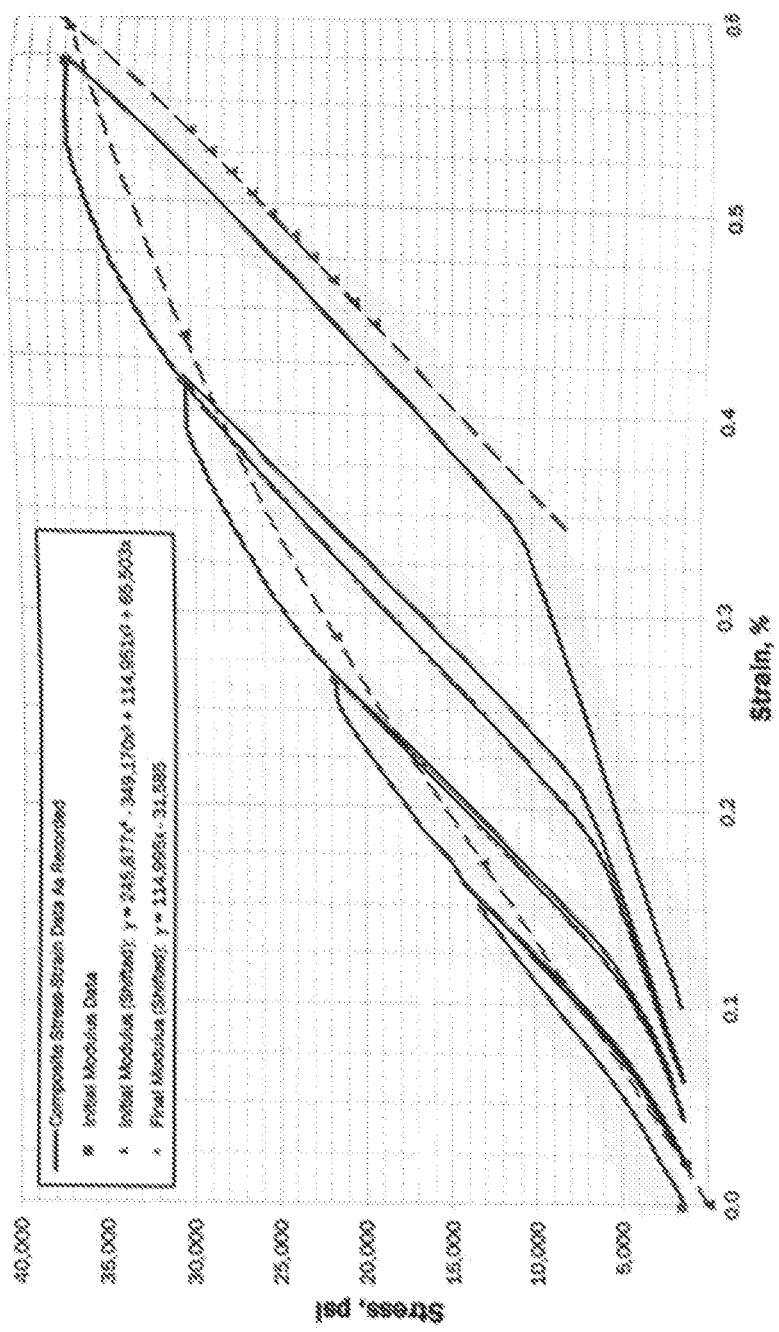
FIG. 2 shows a non-limiting example of composite stress-strain curves as may be understood in various embodiments.

Laboratory testing of plastic deformation of a conductor perhaps under constant tension has been carried out in a similar fashion to that done for stress-strain behavior analysis. This data can be used to predict the effect of high temperature operation, heavy ice loading events, lifetime creep, etc. which can result in additional non-recoverable elongation in a conductor. Each time a conductor may be loaded to a higher stress level, the recoverable elongation or sag may be reduced, as demonstrated in FIG. 2.

A dynamic line rating system may monitor conductor behavior and even track the changes resulting from non-recoverable elongations in order to accurately determine operational capacity and even conductor health.

There may be different computational tools that have been available over the years that can assist with designing a transmission line. Non-limiting examples of approaches to developing a conductor model using these tools may include: a PLS-CADD file based on said original manufacturer conductor specifications for said conductor; a drawing file based on said original manufacturer conductor specifications for said conductor; a finite element model using PLS-CADD based on original LiDAR survey data from said conductor; a ruling span model using PLS-CADD based on original LiDAR survey data from said conductor; a ruling span model using PLS-CADD based on an original plan and profile chart of said conductor and an original sag chart of said conductor; a ruling span model using drawings based on an original plan and profile chart of said conductor and an original sag chart of said conductor; a single span model using drawings based on an original plan and profile chart of said conductor; a single span model using PLS-CADD based on an original plan and profile chart of said conductor; any combination thereof, or the like. An order of most accurate to least accurate conductor models may be ranked:

1. Finite Element Model based on LiDAR survey data (PLS-CADD)
2. Ruling Span Model based on LiDAR survey data (PLS-CADD)
3. Ruling Span Model based on Plan and Profile (P&P)/Sag Charts (PLS-CADD)
4. Ruling Span Model based on P&P/Sag Charts (Drawings)
5. Single Span Model based on P&P's (PLS-CADD or Drawings)

Therefore, it is advantageous to use the most accurate method available for developing a conductor model. Unfortunately, there may not be LiDAR data and the best models provided for the development of the initial conductor behavior model. For example, in some instances P&P drawings may have only been available for development of an initial conductor behavior model. This may have resulted in use of a less accurate method to initially configure the system.

Figure 3:
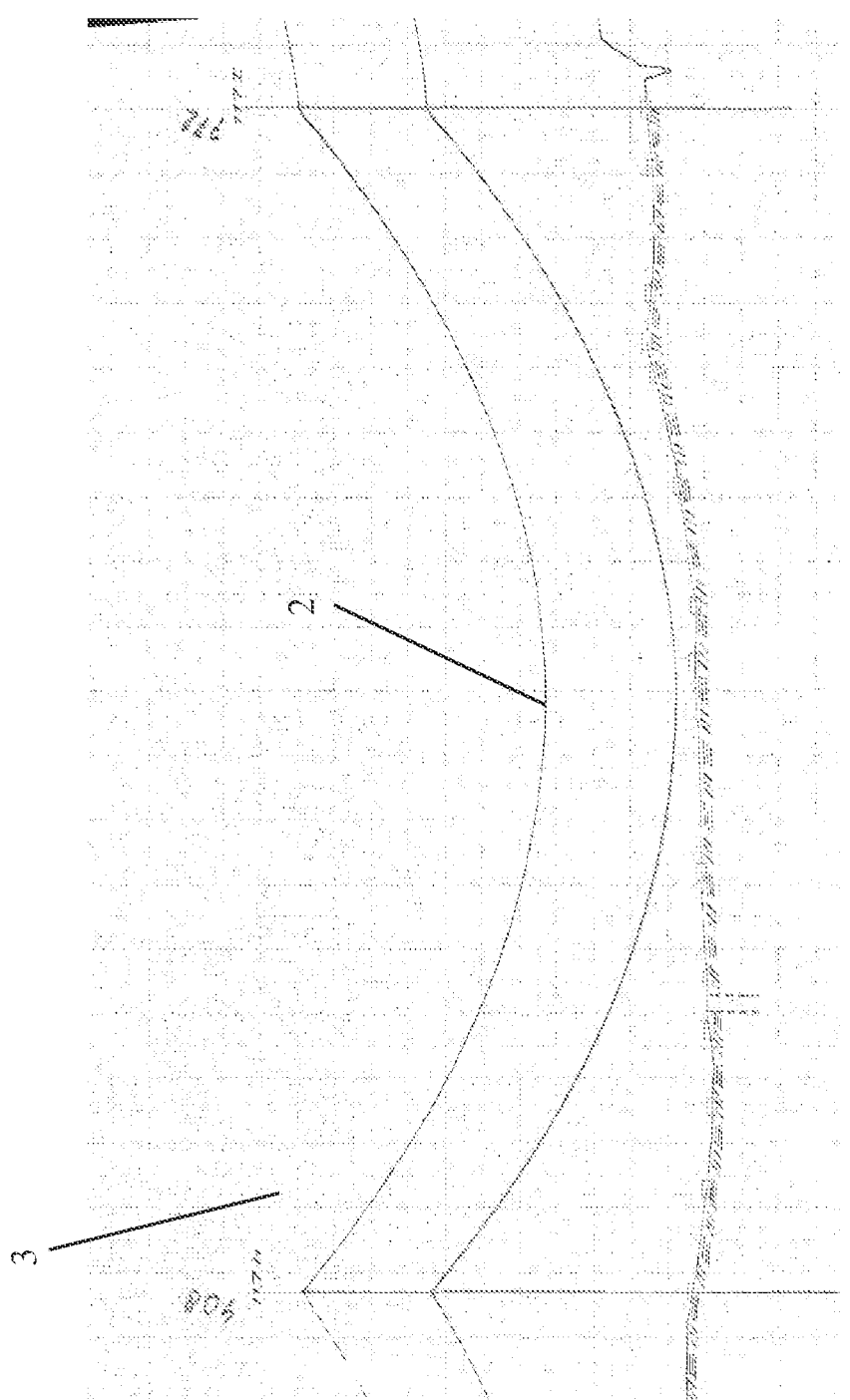
FIG. 3 shows a non-limiting example of an original plan and profile chart in PLS-CADD as may be understood in various embodiments.

As one non-limiting example, a single span modeling approach may begin perhaps by digitally capturing an old scan of a P&P drawing, such as shown in FIG. 3, into a PLS-CADD perhaps such that a span length, ground profile, structure heights, and even conductor sags may be represented. There can be errors in this method such as, but not limited to: calculation of the ruling span when it may not be clear from the P&P drawing exactly where the dead-ends are; or perhaps even identifying the initial sag-tension parameters that may have been used to design the line. Then, initial testing may be done on the conductor where the conductor may be analyzed and initially tested conductor data (14) may be collected such as different stress and strain data which can be used to calibrate an initial sag-tension relationship, creep, and can be used in creating an initially designed conductor health model. A conductor model resulting from this simple single span approach may result in an initial sag-tension relationship identified in TABLE 1 and 2 below and graph shown in FIG. 4.

TABLE 1

| Conductor Temperature | Cable Load Hor. (N/m) | Cable Load Vert (N/m) | Cable Load Res. (N/m) | R.S. Initial Cond. Max Tens. (N) | R.S. Initial Cond. Hori. Tens. (N) | R.S. Initial Cond. Max Ten % UL | R.S. Initial Cond. C (M) | R.S. Initial Cond. R.S. Sag (M) |
|---|---|---|---|---|---|---|---|---|
| −28.9 | 0 | 14.94 | 14.94 | 52209 | 52157 | 42 | 3490 | 2.63 |
| −17.8 | 0 | 14.94 | 14.94 | 49238 | 49185 | 39 | 3291 | 2.79 |
| −1.1 | 0 | 14.94 | 14.94 | 44785 | 44727 | 36 | 2993 | 3.07 |
| 15.6 | 0 | 14.94 | 14.94 | 40404 | 40341 | 32 | 2699 | 3.4 |
| 32.2 | 0 | 14.94 | 14.94 | 36300 | 36231 | 29 | 2424 | 3.79 |
| 48.9 | 0 | 14.94 | 14.94 | 32526 | 32451 | 26 | 2171 | 4.23 |
| 75 | 0 | 14.94 | 14.94 | 27559 | 27473 | 22 | 1838 | 5 |
| 100 | 0 | 14.94 | 14.94 | 23864 | 23766 | 19 | 1590 | 5.78 |

TABLE 2

| Conductor Temperature | R.S. Final Cond. After Creep Max. Tens. (N) | R.S. Final Cond. After Creep Max. Hori Tens. (N) | R.S. Final Cond. After Creep Max Ten % UL | R.S. Final Cond. After Creep C (M) | R.S. Final Cond. After Creep R.S. Sag (M) | R.S. Final Cond. After Load Max. Tens. (N) | R.S. Final Cond. After Load Hori. Tens (N) | R.S. Final Cond. After Load Max Ten % UL | R.S. Final Cond. After Load C (M) | R.S. Final Cond. After Load R.S. Sag (M) |
|---|---|---|---|---|---|---|---|---|---|---|
| −28.9 | 46159 | 46102 | 37 | 3085 | 2.98 | 41524 | 41463 | 33 | 2774 | 3.31 |
| −17.8 | 41866 | 41805 | 33 | 2797 | 3.28 | 37684 | 37618 | 30 | 2517 | 3.65 |
| −1.1 | 36251 | 36182 | 29 | 2421 | 3.79 | 32758 | 32683 | 26 | 2187 | 4.2 |
| 15.6 | 31600 | 31523 | 25 | 2109 | 4.35 | 28818 | 28735 | 23 | 1923 | 4.78 |
| 32.2 | 27881 | 27795 | 22 | 1860 | 4.94 | 25676 | 25584 | 20 | 1712 | 5.36 |
| 48.9 | 24931 | 24837 | 20 | 1662 | 5.53 | 23180 | 23080 | 18 | 1544 | 5.95 |
| 75 | 21469 | 21361 | 17 | 1429 | 6.43 | 20471 | 20359 | 16 | 1362 | 6.74 |
| 100 | 19990 | 19875 | 16 | 1330 | 6.91 | 19434 | 19316 | 15 | 1293 | 7.11 |

Figure 4:
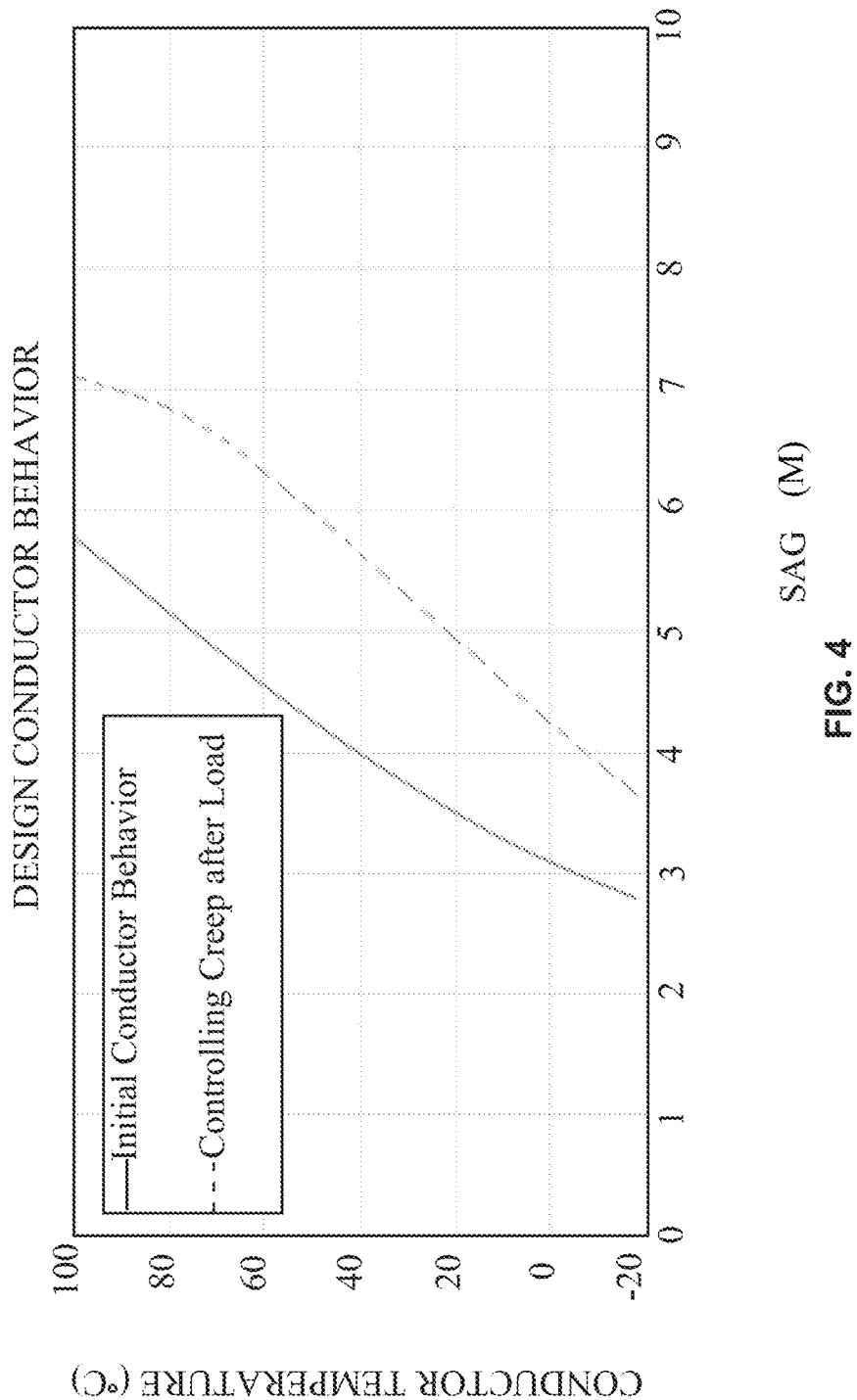
FIG. 4 shows a non-limiting example of a single span model determined sag/tension relationship as may be understood in various embodiments.

Based on this data, an initial combined conductor behavior may be shown as plotted in FIG. 4 and a controlling creep after load may be show as plotted in FIG. 4. Over a short period of time at an observed operating temperature range, a simple model may provide only basic parameters to get a system started. As such, the more accurate the model used to initialize the system, the closer an initial model can be to in-use conductor behavior.

Figure 5:
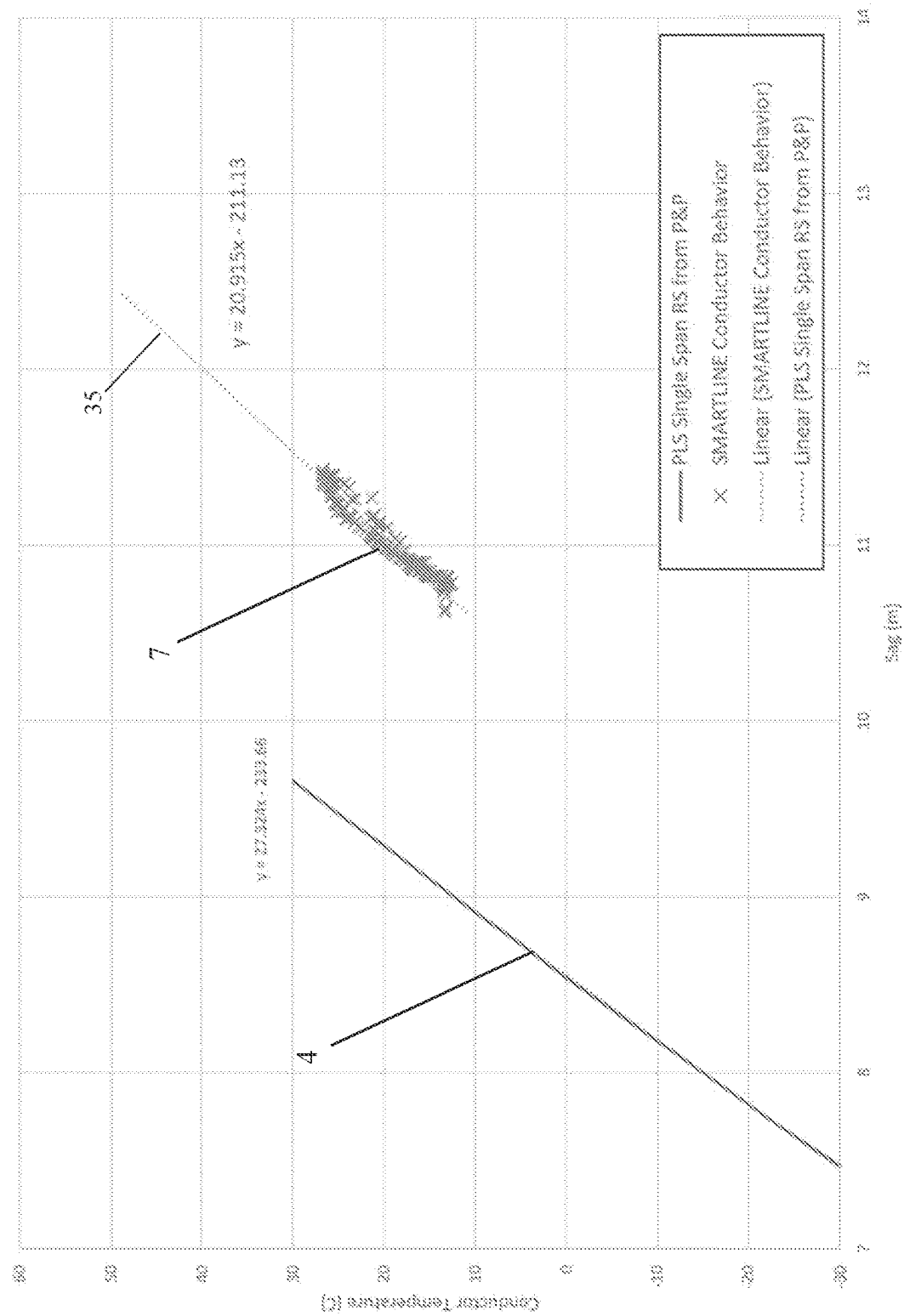
FIG. 5 shows a non-limiting example of a sag model comparison of an initially designed conductor health model and in-use conductor health model as may be understood in various embodiments.

An initially designed conductor health model (4) can be plotted such as shown in FIG. 5 representing the PLS Single Span RS from P&P and using the original manufacturer conductor specifications (1) as discussed above and as represented in FIG. 8.

Measurements of the in-use conductor health data of a conductor may be obtained after installation of the conductor. This may include in-use temperature (5), in-use clearance (6), in-use tilt (15), or the like data which may provide in-use conductor health data (7). The in-use conductor health data may be continually measured and recorded as continual in-use temperature and in-use clearance measurement data. The in-use conductor health data may be plotted (e.g., conductor temperature vs. sag) and an in-use conductor health behavior model (35) may be determined such as shown in FIG. 5. Note that in-use clearance data may be the inverse of sag data. It may also be observed that the monitored conductor points may follow a good linear behavior over the dynamic range of temperatures observed in the data set.

Figure 8:
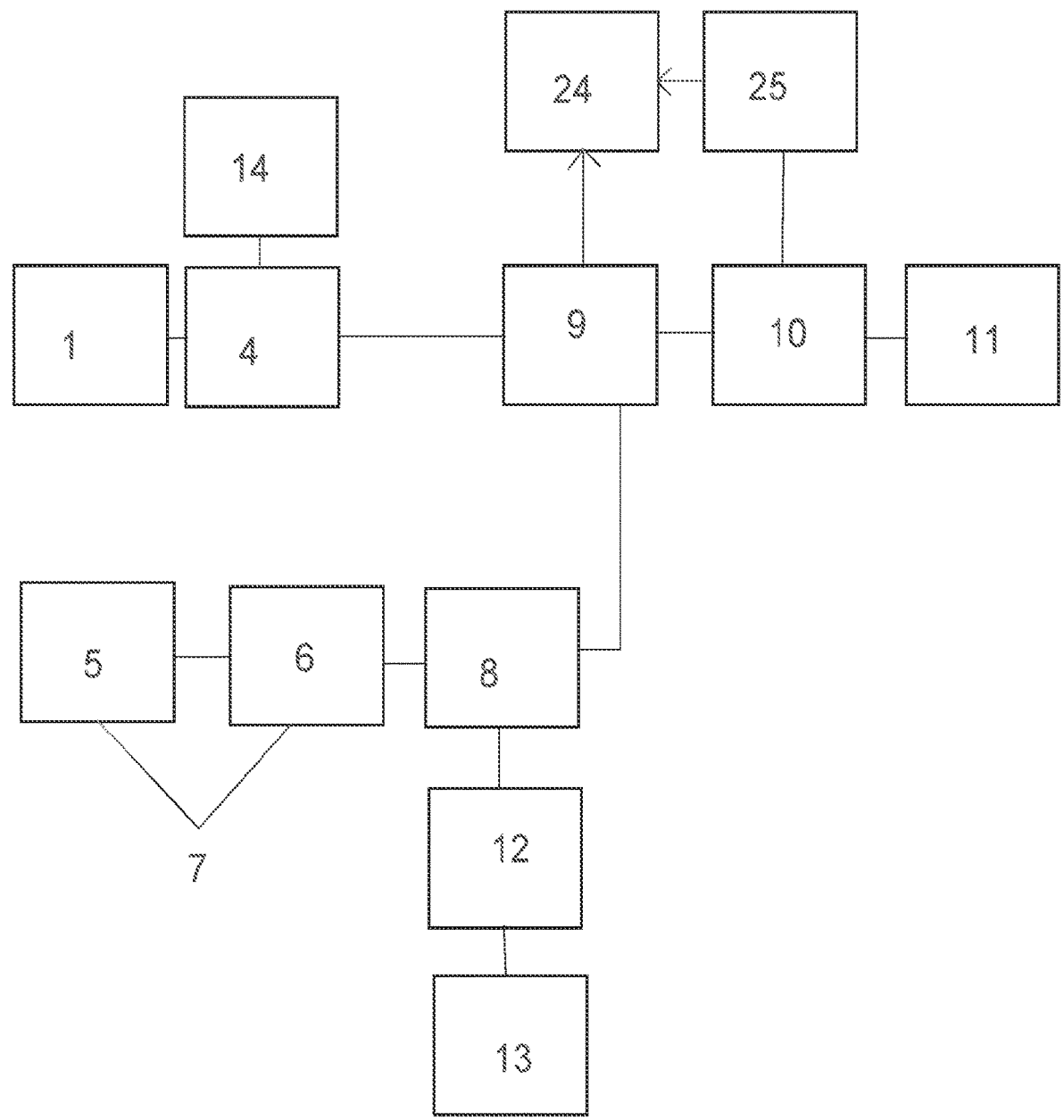
FIG. 8 shows a non-limiting example of a representation of a monitoring system as may be understood in various embodiments.

Since a conductor temperature can vary along each span, a time series average of the temperature may be used. An effective average conductor temperature can be determined from direct clearance monitoring and an established conductor behavior. An effective conductor temperature can be used with heat balance equations to determine a Dynamic Line Rating (DLR). Forecasted DLR ratings can be statistically calibrated to actual DLR ratings. A creep of a conductor can be calculated using a calculated effective high temperature conductor creep (12). A corresponding strength loss (13) can be computed from an effective high temperature conductor creep as represented in FIG. 8.

As show in FIG. 5, the initially designed conductor health model can be compared to monitored conductor data points and its in-use conductor health behavior model (35). It may be understood that an initially designed conductor health model (such as using the initial single span model as calculated above) can have health behavior values that are not aligned with the values of the in-use conductor health behavior model. Here, the monitored conductor data values may not be aligned and the slope may be different. The slope of the initially designed conductor health model $(y=27.324x−233.66)$ may result in more conservative, lower ratings which may lead to inefficient use of a conductor. The slope of the in-use conductor health behavior model here is $y=20.915x−211.13$.

Figure 6:
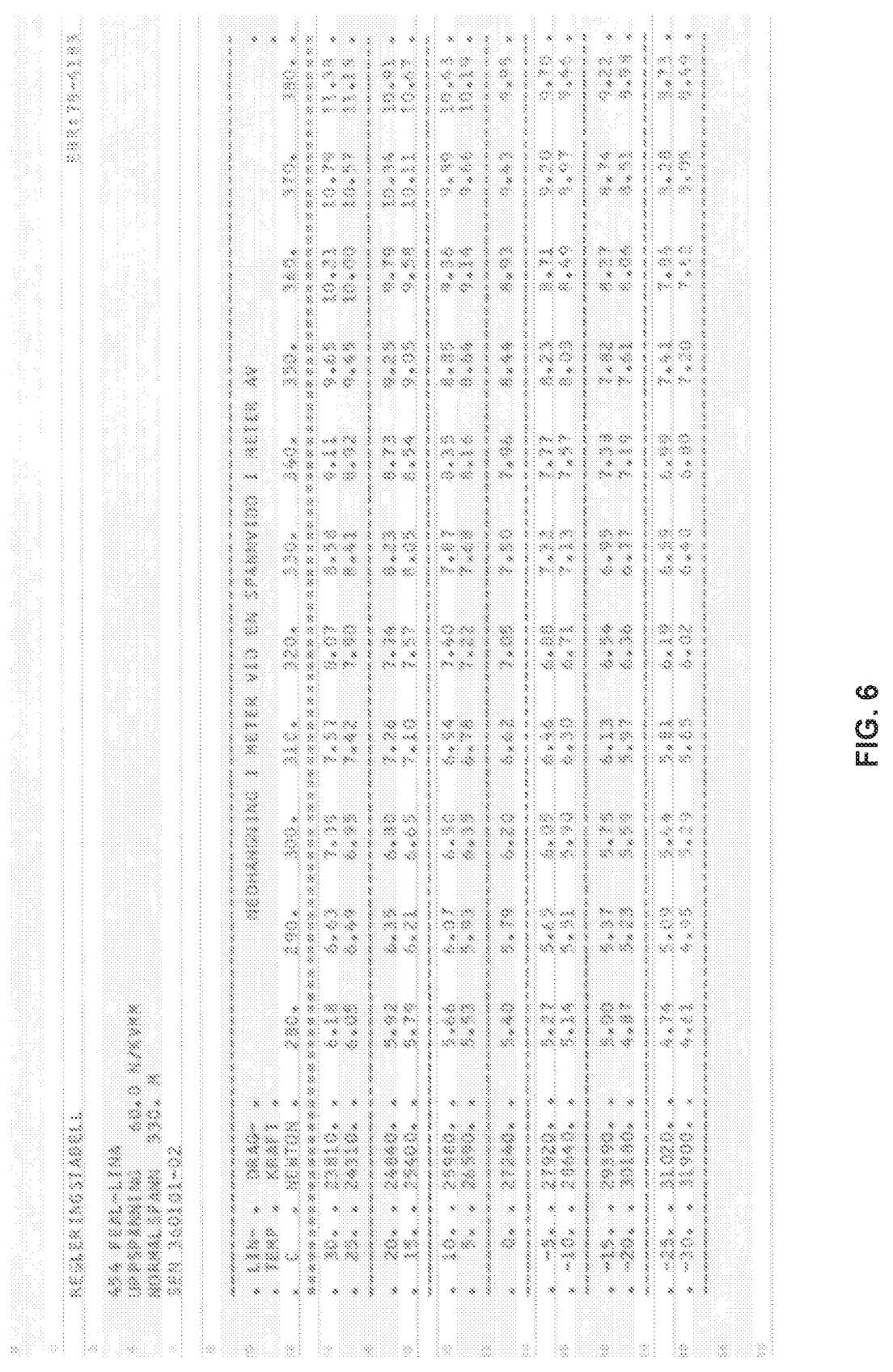
Figure 7:
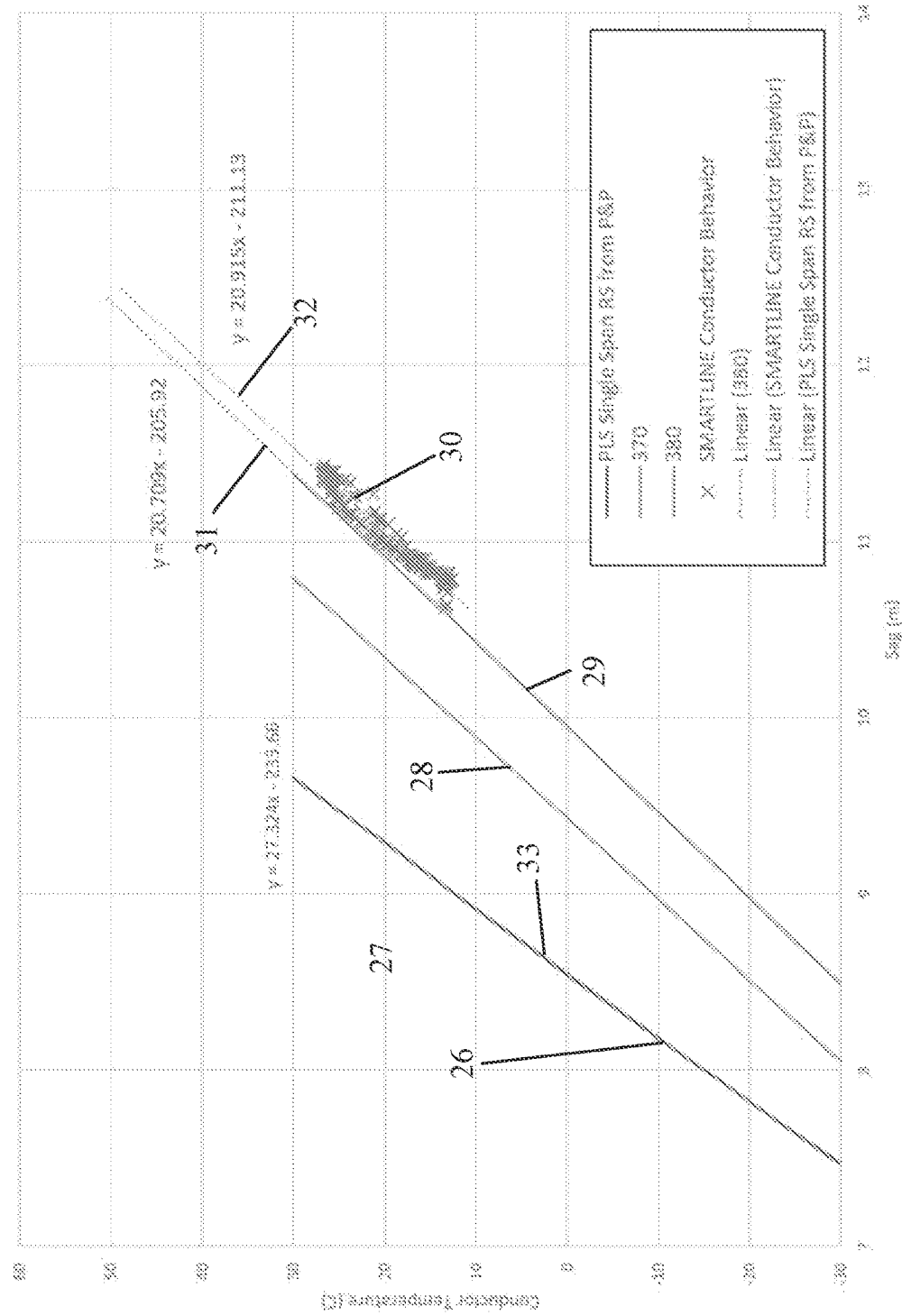
FIG. 7 shows a non-limiting example of a sag chart based model comparison as may be understood in various embodiments.

In a second, non-limiting example, a comparison of the configuration parameters with equivalent parameters from the original sag chart of the conductor was performed. The chart shown in FIG. 6 provides a non-limiting example of an original sag chart of a conductor. Conductor modeling approaches such as using the original sag chart can be plotted into an initially designed conductor health model. FIG. 7 contains the same graph as in FIG. 5 with the addition of the initially designed conductor health model using the original sag chart (shown for both 370 m and 380 m ruling span lengths). The slope of the 380 m ruling span model is $y=20.709x−205.92$. This slope is less than about two tenths of a meter apart from the in-use conductor health behavior model. FIG. 7 provides a PLS single span RS from P&P (26); the graph of 370 m (28); the graph of 380 m (29); the in-use conductor behavior (30); the linear prediction of the 380 m (31); the linear prediction of the in-use conductor behavior (32); and the linear prediction of the PLS single span RS from P&P (33).

As understood in FIG. 7, the original sag chart produced a more accurate model than the single span model from the P&P. This method produced an initial conductor model that not only more accurately predicted the measured data but also may more closely match the behavior predicted by the standard. Design-based sag/stringing charts may provide a more accurate method of determining the initial configuration than was achieved with a single span model alone. However, monitored in-use conductor health data may exhibit additional/unanticipated conductor elongation (determined by sag data) perhaps beyond that predicted by a standard which may be a result of unanticipated high temperature or even ice loading events from the original design. A calibrated conductor health model can take into account an initially designed conductor health model and an in-use conductor health behavior model (using in-use temperature, clearance, and even tilt data). A calibrated conductor health model can provide a conductor strength (10) and the ability to predict a remaining strength (11) of a conductor as represented in FIG. 8.

Embodiments of the application may provide a system having a calibrated conductor health model which may be more conservative than an initially designed conductor health model. In-situ conductor behavior analysis of future data collected from the conductor can allow a system to incrementally improve a conductor health model perhaps as well as to respond appropriately to future potential changes in creep that may occur from high temperature, ice loading events, or the like. In-situ conductor behavior may include in-use conductor health data such as in-use temperature and in-use sag of a conductor. As in-use conductor health data (7) (such as in-use temperature, in-use clearance, and even in-use tilt) may be continually collected thus providing new in-use conductor health data (25), a calibrated conductor health model may be recalibrated (24) as needed and as represented in FIG. 8. In-use conductor health data may be collected throughout the life of a conductor. In-use conductor health data may be collected in three hour or specified running averages which includes clearance, temperature, tilt or the like.

Figure 13:
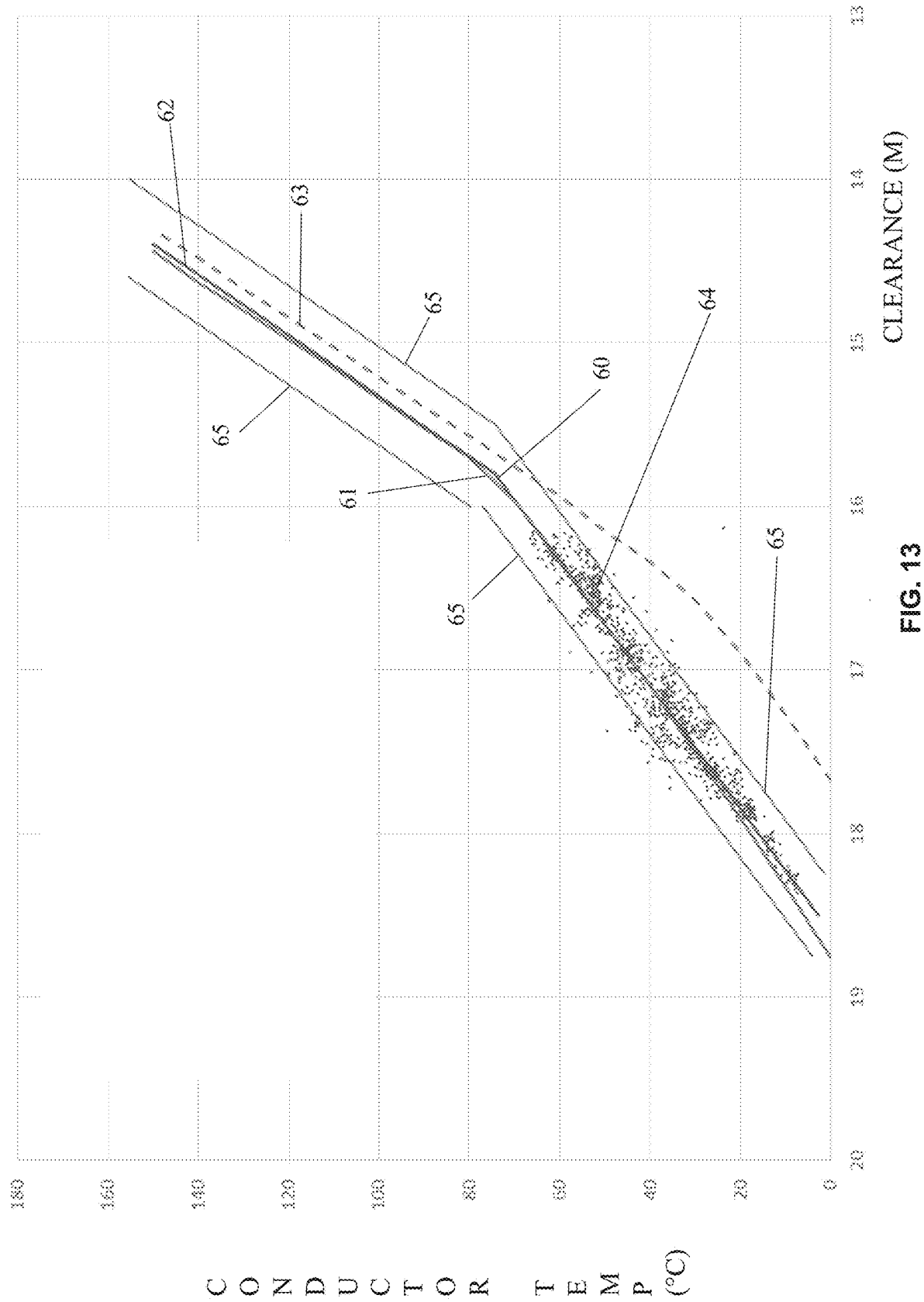
FIG. 13 shows a non-limiting example of a calibrated model of clearance versus conductor temperature as may be understood in various embodiments.

FIG. 13 shows a model of clearance versus conductor temperature including calibrated conductor behavior (60) which may be a calibrated conductor health model, PLS conductor behavior (61) which may be an initially designed conductor health model, calibrated conductor behavior above knee point (62) which may be a calibrated conductor health model, PLS creep behavior (10% strength loss) (63), monitored data (64) and error bars (65). Comparing an initially designed conductor health model with in-use conductor health data (here, clearance and temperature), the model has been calibrated to the calibrated conductor health model (60) and (63).

Systems may use conductor health to monitor residual strength which may allow the ability to predict when it is time to change the conductor. Each conductor wire may be different, may have different effects, may run hot, may have increased creep, or the like. Using specialized systems that monitor each conductor's health can provide tailored feedback for each conductor. In some embodiments, a wire may need to be calibrated first, then obtain the original creep, and then the conductor age may be estimated. Conductor behavior may be used to understand conductor effect of wind or the like. Conductor health may be evaluated by monitoring temperature and even clearance to calculate conductor sag.

Figure 11:
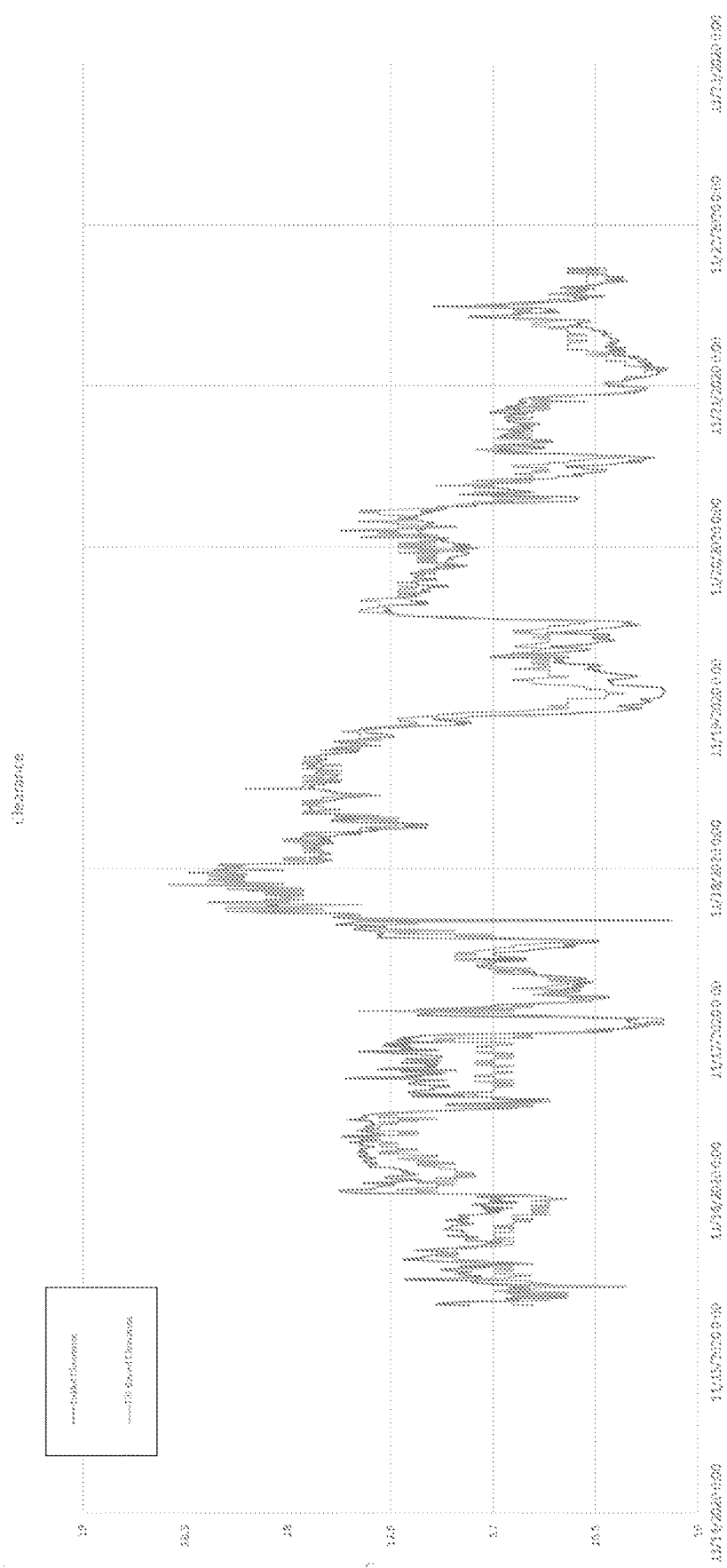
FIG. 11 shows a non-limiting example of in-use clearance and in-use tilt measurements as may be understood in various embodiments.
Figure 12:
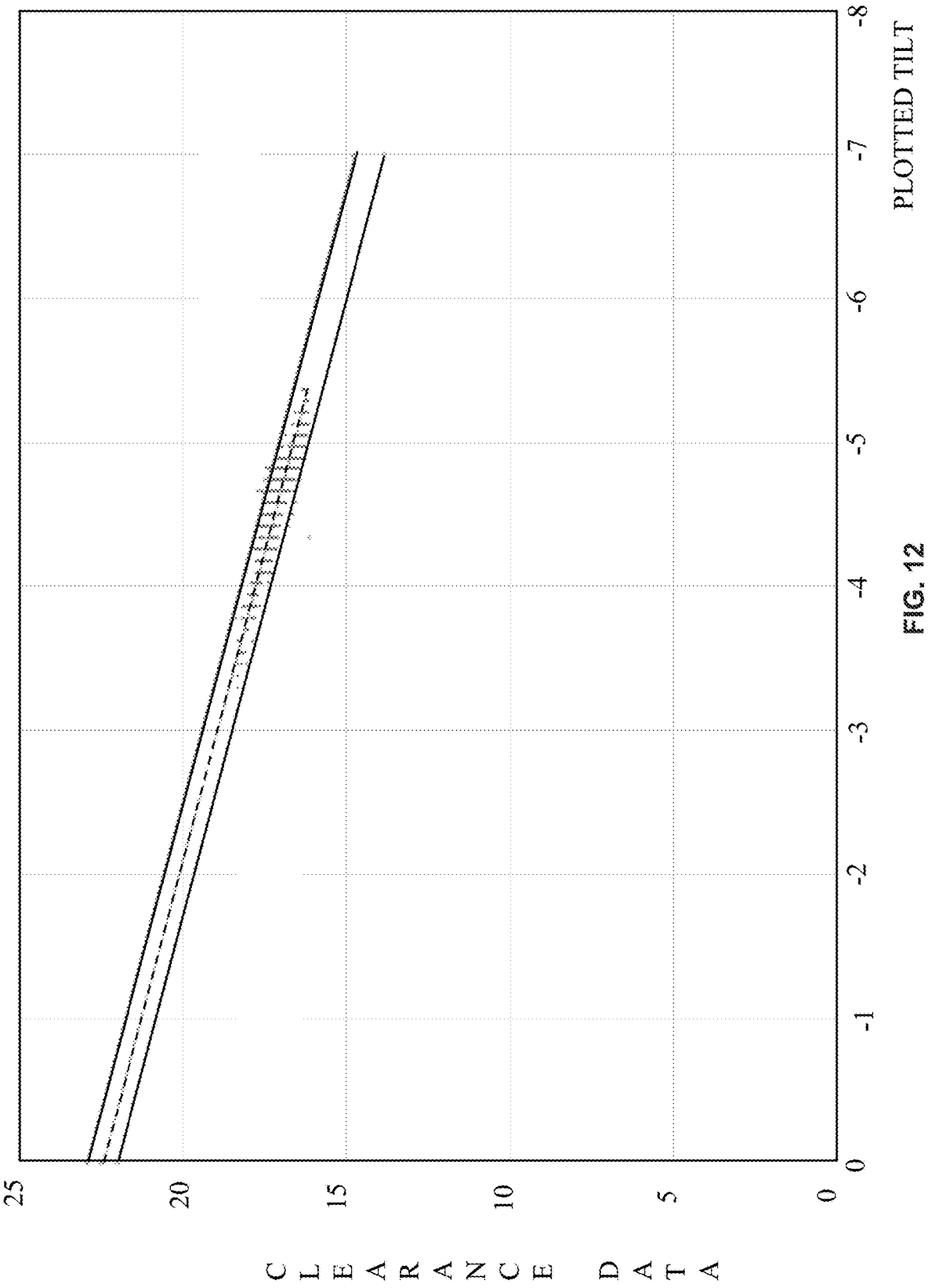
FIG. 12 shows a non-limiting example of a graph of tilt versus clearance as may be understood in various embodiments.

Embodiments may provide tilt-based conductor behavior validation ("TBV"). Direct clearance and conductor temperature monitoring can be an accurate method of determining conductor behavior, but there are moments in time when direct clearance measurements may not be ground measurements. These events in time can be caused by anything new on the ground, such as vegetation, snow, a parked vehicle, or the like. A system can see the change in conductor behavior and dynamically adjust the conductor behavior model. However, it can be difficult to distinguish between a ground variation event and a conductor twist or blowout event where dynamic adjustment can be different for these different types of events. FIG. 11 shows a non-limiting example of in-use tilt data compared to in-use clearance data and FIG. 12 shows a non-limiting example of the plotted tilt versus clearance data where both slopes are identical (y=1.1654x+22.427).

Figure 9:
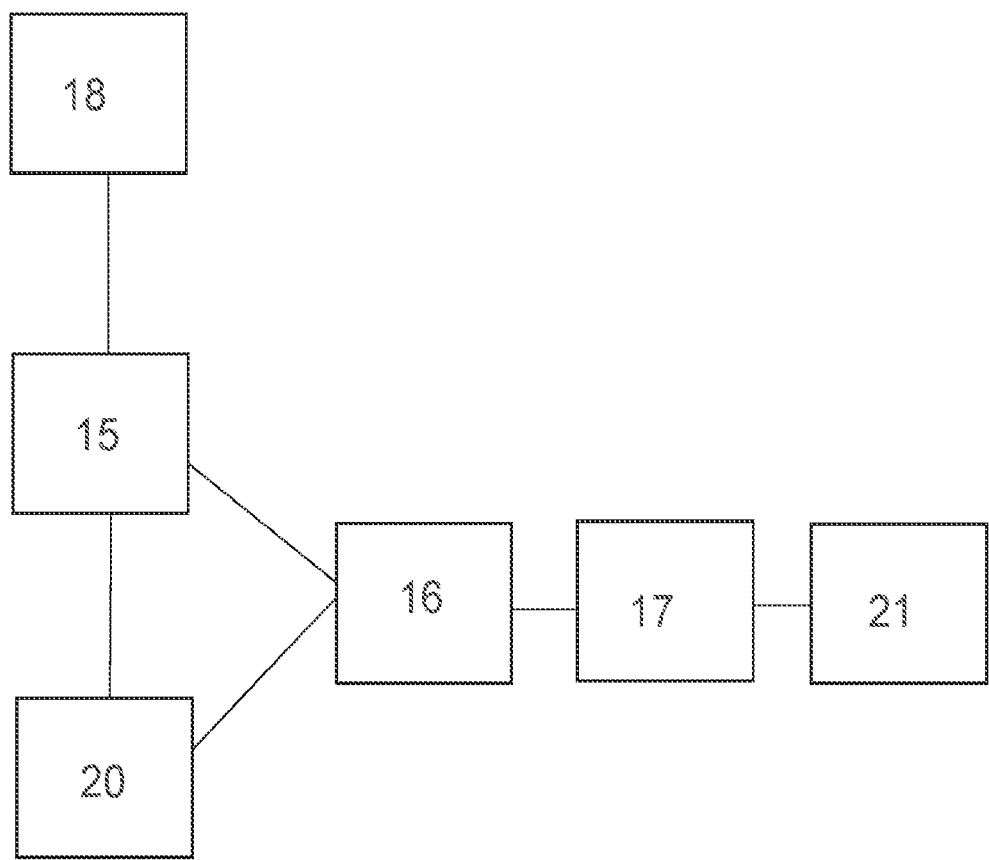
FIG. 9 shows a non-limiting example of a representation of a monitoring system using in-use tilt as may be understood in various embodiments.

A tilt based validation feature may use an inclination and conductor temperature model to validate ground disturbances versus conductor twist, blowout, additional creep, or the like in the in-situ conductor behavior data such as the in-use conductor health data. In-use clearance measurement data may be compared with in-use tilt measurement data. As shown in FIG. 9, When in-use clearance measurements (20) may not correlate to in-use tilt measurements, it may be desirable to evaluate an event for an artificial ground event (16) or a validated event (17). A validated event may promote calculating a new conductor creep and even recalculating the calibrated conductor health model (21). A TBV feature may be used as a secondary conductor behavior model (18) perhaps to validate a clearance-based conductor behavior model. A secondary conductor behavior model may use in-use tilt measured data and in-use temperature measured data. When the two conductor behavior models diverge, there may be a false ground or an inaccurate ground measurement caused by a ground obstruction (artificial event) or an unlevel ground adjustment due twist or blowout (actual creep). Identifying the ground obstruction could be a positive divergence while twist and blowout could be a negative divergence. An artificial ground event may include snow, vegetation on the ground, a parked mobile vehicle, or the like. A validated event may be a twist in a conductor or a conductor blow out event. The TBV based conductor behavior model can validate that the conductor behavior has not changed, and the dynamic adjustments should be implemented. The TBV feature may also provide a secondary confirmation when additional, unanticipated creep may be experienced by the conductor, by identifying when the conductor behavior of both the clearance based and tilt-based model shift down. A simultaneous shift up may be a rare short term in nature and can be caused by rain, which can be validated with collected weather data. In-use tilt data may be used to replace missing clearance data. In some embodiments, in-use tilt measurement data perhaps with tilt based validation may be used to validate dynamic line ratings. For the reasons discussed above, the in-use tilt measurements may be needed when clearance data may be inaccurate or missing or the like.

Figure 10:
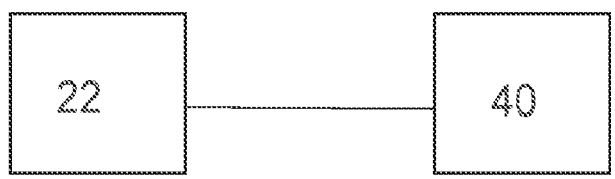
FIG. 10 shows a non-limiting example of a representation of a monitoring system using effective wind as may be understood in various embodiments.

The TBV and CB conductor behavior models can be used to calculate what an average effective wind on the conductor may be experiencing at any moment in time. The heat balance equations in the various standards may be a good sense of the relationship between electrical current and conductor temperature, but the in-situ/in-use conditions may be difficult to capture all the environmental variables accurately. As shown in FIG. 10, effective wind (22) may be incorporated into a recalibrated conductor behavior model (40) and effective wind may be used with an effective ambient temperature cannot be used. A determination of effective wind on the conductor can cancel out some of the inaccuracies caused by the many environmental variables. When needed, incorporation of effective wind into a conductor behavior model may be used. There are times when a conductor becomes super-cooled, such as at night and the heat balance equations cannot account for this. Here calculating effective ambient temperature can be used in these circumstances. However, when effective ambient temperature may be used, effective wind cannot be determined. Either one or the other may be used based on the difference between conductor temperature and ambient temperature.

While the application has been described in connection with some preferred embodiments, it is not intended to limit the scope of the embodiments to the particular form set forth, but on the contrary, it is intended to cover such alternatives, modifications, and equivalents as may be included within the spirit and scope of the embodiments as defined by the statements of embodiments. Examples of alternative claims may include:

1. A method for monitoring and predicting power line conductor health comprising the steps of:
    providing original manufacturer conductor specifications for a conductor;
    installing said conductor in a power line system;

preparing an initially designed conductor health model using said original manufacturer conductor specifications;
continually measuring an in-use temperature and an in-use clearance of said conductor after installation to provide in-use conductor health data;
calculating a creep of said conductor from said in-use conductor health data;
calibrating said initially designed conductor health model with said in-use conductor health data to provide a calibrated conductor health model;
evaluating a strength of a conductor based on said calibrated conductor health model; and
predicting the remaining strength of said conductor.

2. The method as described in clause 1 or any other clause, wherein said step of calculating said creep of said conductor data comprises the step of calculating the effective high temperature conductor creep of said conductor.

3. The method as described in clause 2 or any other clause, wherein said step of calibrating said initially designed conductor health model with said in-use conductor health data comprises the step of computing a corresponding strength loss of said conductor from said effective high temperature conductor creep.

4. The method as described in clause 1 or any other clause, wherein said original manufacturer conductor specifications are chosen from an original sag chart of said conductor, an original plan and profile chart of said conductor, original LiDAR survey data from said conductor, and any combination thereof.

5. The method as described in clause 1 or any other clause, wherein said initially designed conductor health model using said original manufacturer conductor specifications is chosen from:
   a PLS-CADD file based on said original manufacturer conductor specifications for said conductor;
   a drawing file based on said original manufacturer conductor specifications for said conductor;
   a finite element model using PLS-CADD based on original LiDAR survey data from said conductor;
   a ruling span model using PLS-CADD based on original LiDAR survey data from said conductor;
   a ruling span model using PLS-CADD based on an original plan and profile chart of said conductor and an original sag chart of said conductor;
   a ruling span model using drawings based on an original plan and profile chart of said conductor and an original sag chart of said conductor;
   a single span model using drawings based on an original plan and profile chart of said conductor;
   a single span model using PLS-CADD based on an original plan and profile chart of said conductor; and
   any combination thereof.

6. The method as described in clause 1 or any other clause, and further comprising a step of analyzing said conductor and collecting data when said conductor is initially installed and including said data in said initially designed conductor health model.

7. The method as described in clause 6 or any other clause, wherein said data from said analyzing of said conductor when initially installed comprises different stress and strain data used to calibrate creep of the initially installed conductor.

8. The method as described in clause 1 or any other clause, wherein said step of continually measuring an in-use temperature and an in-use clearance of said conductor after installation to provide in-use conductor health data comprises the step of continually measuring an in-use temperature and an in-use clearance of said conductor after installation to provide in-use conductor health data throughout a life of the conductor.

9. The method as described in clause 1 or any other clause, wherein said in-use clearance comprises an inverse of sag data.

10. The method as described in clause 1 or any other clause, wherein said step of continually measuring an in-use temperature and an in-use clearance of said conductor after installation to provide in-use conductor health data comprises a step of measuring said in-use clearance of said conductor with three hour running averages of said in-use clearance.

11. The method as described in clause 1 or any other clause, and further comprising a step of continually measuring an in-use tilt of said conductor after installation.

12. The method as described in clause 11 or any other clause, wherein said step of continually measuring an in-use tilt of said conductor comprises a step of measuring said in-use tilt of said conductor with specified running averages of said in-use tilt.

13. The method as described in clause 11 or any other clause, or any other clause, and further comprising a step of comparing said in-use clearance measurement data with said in-use tilt measurement data.

14. The method as described in clause 13 or any other clause, and further comprising a step of when said in-use clearance measurements do not correlate to said in-use tilt measurements, evaluating an event for an artificial ground event or a validated event.

15. The method as described in clause 13 or any other clause, wherein said validated event comprises calculating a new conductor creep and recalculating said calibrated conductor health model.

16. The method as described in clause 13 or any other clause, wherein said artificial ground event is chosen from snow, vegetation on the ground, and a mobile vehicle.

17. The method as described in clause 13 or any other clause, wherein said validated event comprises a twist in a conductor or a conductor blowout event.

18. The method as described in clause 11 or any other clause, and further comprising a step of creating a secondary calibrated conductor health model from said in-use tilt measured data and said in-use temperature measured data.

19. The method as described in clause 11 or any other clause, and further comprising a step of using said in-use tilt data to replace missing clearance data.

20. The method as described in clause 1 or any other clause, and further comprising a step of determining an effective wind on said conductor and incorporating said effective wind into a recalibrated conductor behavior model.

21. The method as described in clause 20 or any other clause, and further comprising a step of using said effective wind when an effective ambient temperature cannot be used.

22. The method as described in clause 1 or any other clause, and further comprising a step of recalibrating said calibrated conductor health model with new in-use conductor health data.

23. A system for monitoring and predicting power line conductor health comprising:

an initially designed conductor health model using original manufacturer conductor specifications for a conductor in a power line system;

continual in-use temperature and an in-use clearance measurement data of said conductor after installation;

a calibrated conductor health model based on said initially designed conductor health model calibrated with said continual in-use temperature and an in-use clearance measurement data;

a conductor strength based on said calibrated conductor health model; and a predicted remaining strength of said conductor.

24. The system as described in clause 23 or any other clause, and further comprising a creep calculation of said based on a calculated effective high temperature conductor creep of said conductor.

25. The system as described in clause 24 or any other clause, and further comprising a computed corresponding strength loss of said conductor from said effective high temperature conductor creep.

26. The system as described in clause 23 or any other clause, wherein said original manufacturer conductor specifications are chosen from an original sag chart of said conductor, an original plan and profile chart of said conductor, original LiDAR survey data from said conductor, and any combination thereof.

27. The system as described in clause 23 or any other clause, wherein said initially designed conductor health model using said original manufacturer conductor specifications is chosen from:

a PLS-CADD file based on said original manufacturer conductor specifications for said conductor;

a drawing file based on said original manufacturer conductor specifications for said conductor;

a finite element model using PLS-CADD based on original LiDAR survey data from said conductor;

a ruling span model using PLS-CADD based on original LiDAR survey data from said conductor;

a ruling span model using PLS-CADD based on an original plan and profile chart of said conductor and an original sag chart of said conductor;

a ruling span model using drawings based on an original plan and profile chart of said conductor and an original sag chart of said conductor;

a single span model using drawings based on an original plan and profile chart of said conductor;

a single span model using PLS-CADD based on an original plan and profile chart of said conductor; and any combination thereof.

28. The system as described in clause 23 or any other clause, wherein said initially designed conductor health model comprises initially tested conductor data.

29. The system as described in clause 28 or any other clause, wherein said initially tested conductor data comprises different stress and strain data used to calibrate creep of said initially installed conductor.

30. The system as described in clause 23 or any other clause, wherein said continual in-use temperature and an in-use clearance measurement data comprises continual in-use temperature and an in-use clearance measurement data collected throughout a life of the conductor.

31. The system as described in clause 23 or any other clause, wherein said in-use clearance measurement data comprises an inverse of sag data.

32. The system as described in clause 23 or any other clause, wherein said in-use clearance measurement data of said conductor comprises three hour running averages of said in-use clearance measurement data.

33. The system as described in clause 23 or any other clause, and further comprising continual in-use tilt measurement data of said conductor after installation.

34. The system as described in clause 33 or any other clause, wherein said continual in-use tilt measurement data comprises three hour running averages of said in-use tilt measurement data.

35. The system as described in clause 33 or any other clause, and further comprising a comparison of said in-use clearance measurement data with said in-use tilt measurement data.

36. The system as described in clause 35 or any other clause, wherein said comparison of said in-use clearance measurements with said in-use tilt measurements is not correlated comprises an event evaluation of an artificial ground event or a validated event.

37. The system as described in clause 36 or any other clause, wherein said validated event comprises a new conductor creep.

38. The system as described in clause 36 or any other clause, wherein said artificial ground event is chosen from snow, vegetation on the ground, and a mobile vehicle.

39. The system as described in clause 36 or any other clause, wherein said validated event comprises a twist in a conductor or a conductor blowout event.

40. The system as described in clause 23 or any other clause, and further comprising a secondary calibrated conductor health model from said in-use tilt measured data and said in-use temperature measured data.

41. The system as described in clause 23 or any other clause, and further comprising an effective wind measurement data of said conductor and a recalibrated conductor behavior model based on said effective wind measurement data.

42. The system as described in clause 41 or any other clause, wherein said effective wind measurement data replaces effective ambient temperature.

43. The system as described in clause 23 or any other clause, wherein said calibrated conductor health model is recalibrated with new continual in-use temperature and an in-use clearance measurement data of said conductor.

44. The method as described in clause 11 or any other clause, and further comprising a step of using said in-use tilt measurement data to validate dynamic line ratings.

As can be easily understood from the foregoing, the basic concepts of the present application may be embodied in a variety of ways. It involves both conductor prediction techniques as well as devices to accomplish the appropriate conductor predictor. In this application, the conductor prediction techniques are disclosed as part of the results shown to be achieved by the various devices described and as steps which are inherent to utilization. They are simply the natural result of utilizing the devices as intended and described. In addition, while some devices are disclosed, it should be understood that these not only accomplish certain methods but also can be varied in a number of ways. Importantly, as to all of the foregoing, all of these facets should be understood to be encompassed by this disclosure.

The discussion included in this application is intended to serve as a basic description. The reader should be aware that the specific discussion may not explicitly describe all embodiments possible; many alternatives are implicit. It also may not fully explain the generic nature of the application and may not explicitly show how each feature or element can actually be representative of a broader function or of a great variety of alternative or equivalent elements. As one example, terms of degree, terms of approximation, and/or relative terms may be used. These may include terms such as the words: substantially, about, only, and the like. These words and types of words are to be understood in a dictionary sense as terms that encompass an ample or considerable amount, quantity, size, etc. as well as terms that encompass largely but not wholly that which is specified. Further, for this application if or when used, terms of degree, terms of approximation, and/or relative terms should be understood as also encompassing more precise and even quantitative values that include various levels of precision and the possibility of claims that address a number of quantitative options and alternatives. For example, to the extent ultimately used, the existence or non-existence of a substance or condition in a particular input, output, or at a particular stage can be specified as substantially only x or substantially free of x, as a value of about x, or such other similar language. Using percentage values as one example, these types of terms should be understood as encompassing the options of percentage values that include 99.5%, 99%, 97%, 95%, 92% or even 90% of the specified value or relative condition; correspondingly for values at the other end of the spectrum (e.g., substantially free of x, these should be understood as encompassing the options of percentage values that include not more than 0.5%, 1%, 3%, 5%, 8% or even 10% of the specified value or relative condition, all whether by volume or by weight as either may be specified. In context, these should be understood by a person of ordinary skill as being disclosed and included whether in an absolute value sense or in valuing one set of or substance as compared to the value of a second set of or substance. Again, these are implicitly included in this disclosure and should (and, it is believed, would) be understood to a person of ordinary skill in this field. Where the embodiments are described in device-oriented terminology, each element of the device implicitly performs a function. Apparatus claims may not only be included for the device described, but also method or process claims may be included to address the functions the application and each element performs. Neither the description nor the terminology is intended to limit the scope of the claims that will be included in any subsequent patent application.

It should also be understood that a variety of changes may be made without departing from the essence of the various embodiments of the invention(s). Such changes are also implicitly included in the description. They still fall within the scope of the various embodiments of the invention(s). A broad disclosure encompassing both the explicit embodiment(s) shown, the great variety of implicit alternative embodiments, and the broad methods or processes and the like are encompassed by this disclosure and may be relied upon when drafting the claims for any subsequent patent application. It should be understood that such language changes and broader or more detailed claiming may be accomplished at a later date (such as by any required deadline) or in the event the applicant subsequently seeks a patent filing based on this filing. With this understanding, the reader should be aware that this disclosure is to be understood to support any subsequently filed patent application that may seek examination of as broad a base of claims as deemed within the applicant's right and may be designed to yield a patent covering numerous aspects of the application both independently and as an overall system.

Further, each of the various elements of the invention(s) and claims may also be achieved in a variety of manners. Additionally, when used or implied, an element is to be understood as encompassing individual as well as plural structures that may or may not be physically connected. This disclosure should be understood to encompass each such variation, be it a variation of an embodiment of any apparatus embodiment, a method or process embodiment, or even merely a variation of any element of these. Particularly, it should be understood that as the disclosure relates to elements of the invention(s), the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention(s) is entitled. As but one example, it should be understood that all actions may be expressed as a means for taking that action or as an element which causes that action. Similarly, each physical element disclosed should be understood to encompass a disclosure of the action which that physical element facilitates. Regarding this last aspect, as but one example, the disclosure of a "monitor" should be understood to encompass disclosure of the act of "monitoring"—whether explicitly discussed or not—and, conversely, were there effectively disclosure of the act of "monitoring", such a disclosure should be understood to encompass disclosure of a "monitor" and even a "means for monitoring." Such changes and alternative terms are to be understood to be explicitly included in the description. Further, each such means (whether explicitly so described or not) should be understood as encompassing all elements that can perform the given function, and all descriptions of elements that perform a described function should be understood as a non-limiting example of means for performing that function.

Any patents, publications, or other references mentioned in this application for patent are hereby incorporated by reference. Any priority case(s) claimed by this application is hereby appended and hereby incorporated by reference. In addition, as to each term used it should be understood that unless its utilization in this application is inconsistent with a broadly supporting interpretation, common dictionary definitions should be understood as incorporated for each term and all definitions, alternative terms, and synonyms such as contained in the Random House Webster's Unabridged Dictionary, second edition are hereby incorporated by reference. Finally, all references listed in the list below or other information statement filed with the application are hereby appended and hereby incorporated by reference, however, as to each of the above, to the extent that such information or statements incorporated by reference might be considered inconsistent with the patenting of the various embodiments of invention(s) such statements are expressly not to be considered as made by the applicant(s).

| U.S. PATENTS | | | |
|---|---|---|---|
| Pat. No. | Kind Code | Issue Date | Name of Patentee of Applicant of cited Document |
| 9,519,014 | B2 | 2016 Dec. 13 | Aaserude et al. |

U.S. PATENT APPLICATION PUBLICATIONS

| Publication Number | Kind Code | Publication Date | Name of Patentee of Applicant of cited Document |
|---|---|---|---|
| 20190235011 | A1 | 2019 Aug. 1 | Pinney et al. |

FOREIGN PATENT DOCUMENTS

| Foreign Document Number | Country Code | Kind Code | Publication Date | Name of Patentee of Applicant of cited Document |
|---|---|---|---|---|
| 2019147965 | WO | A1 | 2019 Aug. 1 | LINEVISION INC. |

NON-PATENT LITERATURE DOCUMENTS

Harvey, J R, "Effect of Elevated Temperature Operations on the Strength of Aluminum Conductors," IEEE Transactions on Power Apparatus and Systems, Vol. PAS-91, pp. 1769-1772, September 1972.
"IEEE Guide for Determining the Effects of High-Temperature Operation on Conductors, Connectors, and Accessories," IEEE Standard 1283-2004.
Harvey, J R, "Creep Equations of Conductors for Sag-Tension Calculations," 1972 IEEE/PES Winter Meeting Conference Paper No. C72 190-2
Overhead Conductor Manual 3rd Edition, SOUTHWIRE © 2017. 1 page.
Seppa, Tapani O., "Factors Influencing the Accuracy of High Temperature Sag Calculations," IEEE/PES Summer Power Meeting Paper No. 93 SM 440-8 PWRD, 1993.
Harvey, J R, "Creep of Transmission Line Conductors," IEEE Trans., Vol. PAS-88, No. 4, pp 281-285, April 1969.
MARMILLO, Jonathan, LineVision Inc. Southwest Power Pool Technology Expo 2018. © 2018. 42 pages.
Stephen, R. et al., Guide for Application of Direct Real-Time Monitoring Systems, Working Group B2.36, June 2012, © 2012. ISBN 978-2-85873-190-9. 79 pages.
NARANPANAWE, L., et al., Overhead Conductor Condition Monitoring, Milestone Report 1. The University of Queensland, Brisbane, Queensland. December 2018. 52 pages.

Thus, the applicant(s) should be understood to have support to claim and make claims to embodiments including at least: i) each of the conductor predicting devices as herein disclosed and described, ii) the related methods disclosed and described, iii) similar, equivalent, and even implicit variations of each of these devices and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such processes, methods, systems or components, ix) each system, method, and element shown or described as now applied to any specific field or devices mentioned, x) methods and apparatuses substantially as described hereinbefore and with reference to any of the accompanying examples, xi) an apparatus for performing the methods described herein comprising means for performing the steps, xii) the various combinations and permutations of each of the elements disclosed, xiii) each potentially dependent claim or concept as a dependency on each and every one of the independent claims or concepts presented, and xiv) all inventions described herein.

In addition and as to computer aspects and each aspect amenable to programming or other electronic automation, it should be understood that in characterizing these and all other aspects of the various embodiments of the invention(s)—whether characterized as a device, a capability, an element, or otherwise, because all of these can be implemented via software, hardware, or even firmware structures as set up for a general purpose computer, a programmed chip or chipset, an ASIC, application specific controller, subroutine, or other known programmable or circuit specific structure—it should be understood that all such aspects are at least defined by structures including, as person of ordinary skill in the art would well recognize: hardware circuitry, firmware, programmed application specific components, and even a general purpose computer programmed to accomplish the identified aspect. For such items implemented by programmable features, the applicant(s) should be understood to have support to claim and make a statement of invention to at least: xv) processes performed with the aid of or on a computer, machine, or computing machine as described throughout the above discussion, xvi) a programmable apparatus as described throughout the above discussion, xvii) a computer readable memory encoded with data to direct a computer comprising means or elements which function as described throughout the above discussion, xviii) a computer, machine, or computing machine configured as herein disclosed and described, xix) individual or combined subroutines and programs as herein disclosed and described, xx) a carrier medium carrying computer readable code for control of a computer to carry out separately each and every individual and combined method described herein or in any claim, xxi) a computer program to perform separately each and every individual and combined method disclosed, xxii) a computer program containing all and each combination of means for performing each and every individual and combined step disclosed, xxiii) a storage medium storing each computer program disclosed, xxiv) a signal carrying a computer program disclosed, xxv) a processor executing instructions that act to achieve the steps and activities detailed, xxvi) circuitry configurations (including configurations of transistors, gates, and the like) that act to sequence and/or cause actions as detailed, xxvii) computer readable medium(s) storing instructions to execute the steps and cause activities detailed, xxviii) the related methods disclosed and described, xxix) similar, equivalent, and even implicit variations of each of these systems and methods, xxx) those alternative designs which accomplish each of the functions shown as are disclosed and described, xxxi) those alternative designs and methods which accomplish each of the functions shown as are implicit to accomplish that which is disclosed and described, xxxii) each feature, component, and step shown as separate and independent inventions, and xxxiii) the various combinations of each of the above and of any aspect, all without limiting other aspects in addition.

With regard to claims whether now or later presented for examination, it should be understood that for practical reasons and so as to avoid great expansion of the examination burden, the applicant may at any time present only initial claims or perhaps only initial claims with only initial dependencies. The office and any third persons interested in potential scope of this or subsequent applications should understand that broader claims may be presented at a later date in this case, in a case claiming the benefit of this case, or in any continuation in spite of any preliminary amendments, other amendments, claim language, or arguments presented, thus throughout the pendency of any case there is no intention to disclaim or surrender any potential subject matter. It should be understood that if or when broader claims are presented, such may require that any relevant prior art that may have been considered at any prior time may need to be re-visited since it is possible that to the extent any amendments, claim language, or arguments presented in this or any subsequent application are considered as made to avoid such prior art, such reasons may be eliminated by later presented claims or the like. Both the examiner and any person otherwise interested in existing or later potential coverage, or considering if there has at any time been any possibility of an indication of disclaimer or surrender of potential coverage, should be aware that no such surrender or disclaimer is ever intended or ever exists in this or any subsequent application. Limitations such as arose in *Hakim v. Cannon Avent Group, PLC*, 479 F.3d 1313 (Fed. Cir 2007), or the like are expressly not intended in this or any subsequent related matter. In addition, support should be understood to exist to the degree required under new matter laws—including but not limited to European Patent Convention Article 123(2) and United States Patent Law 35 USC 132 or other such laws—to permit the addition of any of the various dependencies or other elements presented under one independent claim or concept as dependencies or elements under any other independent claim or concept. In drafting any claims at any time whether in this application or in any subsequent application, it should also be understood that the applicant has intended to capture as full and broad a scope of coverage as legally available. To the extent that insubstantial substitutes are made, to the extent that the applicant did not in fact draft any claim so as to literally encompass any particular embodiment, and to the extent otherwise applicable, the applicant should not be understood to have in any way intended to or actually relinquished such coverage as the applicant simply may not have been able to anticipate all eventualities; one skilled in the art, should not be reasonably expected to have drafted a claim that would have literally encompassed such alternative embodiments.

Further, if or when used, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible. The use of the phrase, "or any other claim" is used to provide support for any claim to be dependent on any other claim, such as another dependent claim, another independent claim, a previously listed claim, a subsequently listed claim, and the like. As one clarifying example, if a claim were dependent "on claim 20 or any other claim" or the like, it could be re-drafted as dependent on claim 1, claim 15, or even claim 25 (if such were to exist) if desired and still fall with the disclosure. It should be understood that this phrase also provides support for any combination of elements in the claims and even incorporates any desired proper antecedent basis for certain claim combinations such as with combinations of method, apparatus, process, and the like claims.

Finally, any claims set forth at any time are hereby incorporated by reference as part of this description of the various embodiments of the application, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

The invention claimed is:

1. A method for monitoring and predicting power line conductor health comprising the steps of:
   providing original manufacturer conductor specifications for a conductor;
   installing said conductor in a power line system;
   preparing an initially designed conductor health model using said original manufacturer conductor specifications;
   continually measuring an in-use temperature and an in-use clearance data of said conductor after installation to provide in-use conductor health data;
   calculating a creep of said conductor from said in-use conductor health data;
   calibrating said initially designed conductor health model with said in-use conductor health data to provide a calibrated conductor health model;
   evaluating a strength of said conductor based on said calibrated conductor health model; and
   predicting a remaining strength of the conductor.

2. The method for monitoring and predicting power line conductor health as described in claim 1, wherein the step of calculating the creep of the conductor from the in-use conductor health data comprises a step of calculating an effective high temperature conductor creep of said conductor.

3. The method for monitoring and predicting power line conductor health as described in claim 2, wherein said step of calibrating said initially designed conductor health model with said in-use conductor health data comprises a step of computing a corresponding strength loss of said conductor from said effective high temperature conductor creep.

4. The method for monitoring and predicting power line conductor health as described in claim 1, wherein said original manufacturer conductor specifications are chosen from an original sag chart of said conductor, an original plan and profile chart of said conductor, original LiDAR survey data from said conductor, and any combination thereof.

5. The method for monitoring and predicting power line conductor health as described in claim 1, wherein said initially designed conductor health model using said original manufacturer conductor specifications is chosen from:
   a PLS-CADD file based on said original manufacturer conductor specifications for said conductor;
   a drawing file based on said original manufacturer conductor specifications for said conductor;
   a finite element model using PLS-CADD based on original LiDAR survey data from said conductor;
   a ruling span model using PLS-CADD based on the original LiDAR survey data from said conductor;
   a ruling span model using PLS-CADD based on an original plan and profile chart of said conductor and an original sag chart of said conductor;
   a ruling span model using drawings based on the original plan and profile chart of said conductor and the original sag chart of said conductor;
   a single span model using the drawings based on the original plan and profile chart of said conductor;
   the single span model using PLS-CADD based on the original plan and profile chart of said conductor; and
   any combination thereof.

6. The method for monitoring and predicting power line conductor health as described in claim 1, further comprising a step of analyzing said conductor and collecting in-use conductor health data when said conductor is initially installed and including said in-use conductor health data in said initially designed conductor health model.

7. The method for monitoring and predicting power line conductor health as described in claim 6, wherein said in-use conductor health data from said analyzing said conductor when initially installed comprises different stress and strain data used to calibrate creep of the conductor.

8. The method for monitoring and predicting power line conductor health as described in claim 1, wherein said step of continually measuring an in-use temperature and an in-use clearance data of said conductor after installation to provide in-use conductor health data comprises the step of continually measuring the in-use temperature and the in-use clearance data of said conductor after installation to provide in-use conductor health data throughout a life of the conductor.

9. The method for monitoring and predicting power line conductor health as described in claim 1, wherein said in-use clearance data comprises an inverse of sag data.

10. The method for monitoring and predicting power line conductor health as described in claim 1, wherein said step of continually measuring an in-use temperature and an in-use clearance data of said conductor after installation to provide in-use conductor health data comprises a step of measuring said in-use clearance data of said conductor with three hour running averages of said in-use clearance data.

11. The method for monitoring and predicting power line conductor health as described in claim 1, further comprising a step of continually measuring an in-use tilt data of said conductor after installation.

12. The method for monitoring and predicting power line conductor health as described in claim 11, wherein said step of continually measuring an in-use tilt data of said conductor comprises a step of measuring said in-use tilt data of said conductor with specified running averages of said in-use tilt data of said conductor.

13. The method for monitoring and predicting power line conductor health as described in claim 11, further comprising a step of comparing said in-use clearance data with said in-use tilt data of said conductor.

14. The method for monitoring and predicting power line conductor health as described in claim 13, further comprising a step of when said in-use clearance data do not correlate to said in-use tilt data of said conductor, evaluating an event for an artificial ground event or a validated event.

15. The method for monitoring and predicting power line conductor health as described in claim 14 wherein said validated event comprises calculating a new conductor creep and recalculating said calibrated conductor health model.

16. The method for monitoring and predicting power line conductor health as described in claim 14 wherein said artificial ground event is chosen from snow, vegetation on the ground, and a mobile vehicle.

17. The method for monitoring and predicting power line conductor health as described in claim 14 wherein said validated event comprises a twist in a conductor or a conductor blowout event.

18. The method for monitoring and predicting power line conductor health as described in claim 11, further comprising a step of creating a secondary calibrated conductor health model from the in-use tilt measured data and said in-use temperature measured data of said conductor.

19. The method for monitoring and predicting power line conductor health as described in claim 11, wherein the step of continually measuring an in-use tilt further comprises a step of measuring in-use clearance data, wherein, when clearance data may be inaccurate or missing, the clearance data can be replaced by the in-use tilt data.

20. The method for monitoring and predicting power line conductor health as described in claim 1, further comprising a step of determining an effective wind on said conductor and incorporating said effective wind into a recalibrated conductor behavior model.

21. The method for monitoring and predicting power line conductor health as described in claim 20, further comprising a step of using said effective wind when an effective ambient temperature cannot be used.

22. The method for monitoring and predicting power line conductor health as described in claim 1, further comprising a step of recalibrating said calibrated conductor health model with new in-use conductor health data.

23. A system for monitoring and predicting power line conductor health comprising:
   an initially designed conductor health model using original manufacturer conductor specifications for a conductor in a power line system;
   continual in-use temperature and an in-use clearance measurement data of said conductor after installation;
   a calibrated conductor health model based on said initially designed conductor health model calibrated with said continual in-use temperature and an in-use clearance measurement data;
   a conductor strength based on said calibrated conductor health model;
   a predicted remaining strength of said conductor, and
   a creep calculation of said conductor based on a calculated effective high temperature conductor creep of said conductor.

24. The system for monitoring and predicting power line conductor health as described in claim 23, further comprising a creep calculation of said conductor based on a calculated effective high temperature conductor creep of said conductor.

25. The system for monitoring and predicting power line conductor health as described in claim 24, further comprising a computed corresponding strength loss of said conductor from said calculated effective high temperature conductor creep.

26. The system for monitoring and predicting power line conductor health as described in claim 24, wherein said original manufacturer conductor specifications are chosen from an original sag chart of said conductor, an original plan and profile chart of said conductor, original LiDAR survey data from said conductor, and any combination thereof.

27. The system for monitoring and predicting power line conductor health as described in claim 24 wherein said initially designed conductor health model using said original manufacturer conductor specifications is chosen from:
 a PLS-CADD file based on said original manufacturer conductor specifications for said conductor;
 a drawing file based on said original manufacturer conductor specifications for said conductor;
 a finite element model using PLS-CADD based on original LiDAR survey data from said conductor;
 a ruling span model using PLS-CADD based on the original LiDAR survey data from said conductor;
 a ruling span model using PLS-CADD based on an original plan and profile chart of said conductor and an original sag chart of said conductor;
 a ruling span model using drawings based on the original plan and profile chart of said conductor and the original sag chart of said conductor;
 a single span model using the drawings based on the original plan and profile chart of said conductor;
 the single span model using PLS-CADD based on the original plan and profile chart of said conductor; and
 any combination thereof.

28. The system for monitoring and predicting power line conductor health as described in claim 24 wherein said initially designed conductor health model comprises initially tested conductor data.

29. The system for monitoring and predicting power line conductor health as described in claim 28, wherein said initially tested conductor data comprises different stress and strain data used to calibrate creep of said conductor using the original manufacturer conductor specifications.

30. The system for monitoring and predicting power line conductor health as described in claim 23, wherein said continual in-use temperature and in-use clearance measurement data comprises the continual in-use temperature and the in-use clearance measurement data collected throughout a life of the conductor.

31. The system for monitoring and predicting power line conductor health as described in claim 23, wherein said in-use clearance measurement data comprises an inverse of sag data.

32. The system for monitoring and predicting power line conductor health as described in claim 23, wherein said in-use clearance measurement data of said conductor comprises three hour running averages of said in-use clearance measurement data.

33. The system for monitoring and predicting power line conductor health as described in claim 23, further comprising continual in-use tilt measurement data of said conductor after installation.

34. The system for monitoring and predicting power line conductor health as described in claim 33z wherein said continual in-use tilt measurement data comprises three hour running averages of said in-use tilt measurement data.

35. The system for monitoring and predicting power line conductor health as described in claim 33z further comprising a comparison of said in-use clearance measurement data with said in-use tilt measurement data.

36. The system for monitoring and predicting power line conductor health as described in claim 35, wherein said comparison of said in-use clearance measurement data with said in-use tilt measurement data is not correlated comprises an event evaluation of an artificial ground event or a validated event.

37. The system for monitoring and predicting power line conductor health as described in claim 36, wherein said validated event comprises a new conductor creep.

38. The system for monitoring and predicting power line conductor health as described in claim 36, wherein said artificial ground event is chosen from snow, vegetation on the ground, and a mobile vehicle.

39. The system for monitoring and predicting power line conductor health as described in claim 36, wherein said validated event comprises a twist in a conductor or a conductor blowout event.

40. The system for monitoring and predicting power line conductor health as described in claim 23, further comprising a secondary calibrated conductor health model based on in-use tilt measured data and said in-use temperature measured data.

41. The system for monitoring and predicting power line conductor health as described in claim 23, further comprising an effective wind measurement data of said conductor and a recalibrated conductor behavior model based on said effective wind measurement data.

42. The system for monitoring and predicting power line conductor health as described in claim 41, wherein said effective wind measurement data is used to produce secondary calibrated conductor data.

43. The system for monitoring and predicting power line conductor health as described in claim 23, wherein said calibrated conductor health model is recalibrated with new continual in-use temperature and an in-use clearance measurement data of said conductor.

44. The method for monitoring and predicting power line conductor health as described in claim 11, further comprising a step of using said in-use tilt of said conductor to validate dynamic line ratings.

\* \* \* \* \*